United States Patent
Kiriaki et al.

(10) Patent No.: US 6,262,677 B1
(45) Date of Patent: Jul. 17, 2001

(54) SAMPLE-AND-HOLD CIRCUIT

(75) Inventors: Sami Kiriaki, Garland; Mark A. Wolfe, Dallas, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/178,716

(22) Filed: Oct. 26, 1998

Related U.S. Application Data

(60) Provisional application No. 60/063,916, filed on Oct. 31, 1997.

(51) Int. Cl.[7] .................................................. H03M 1/00
(52) U.S. Cl. .............................................. 341/122; 327/94
(58) Field of Search .................................. 341/122, 155; 327/94, 96

(56) References Cited

U.S. PATENT DOCUMENTS

| | | | | |
|---|---|---|---|---|
| 4,263,521 | * | 4/1981 | Senger ................................. | 341/122 |
| 4,370,572 | * | 1/1983 | Cosand et al. ....................... | 341/122 |
| 4,459,699 | * | 7/1984 | Monticelli et al. .................. | 341/122 |
| 5,182,560 | * | 1/1993 | Shiwaku .............................. | 341/158 |
| 5,313,113 | * | 5/1994 | Linder ................................. | 307/353 |
| 5,341,037 | * | 8/1994 | Miki et al. ........................... | 307/352 |
| 5,416,484 | * | 5/1995 | Lofstrom ............................. | 341/159 |
| 6,028,459 | * | 2/2000 | Birdsall et al. ...................... | 327/94 |

OTHER PUBLICATIONS

Kiriaki, et al., A 160 Mhz Analog Equalizer for Magnetic Disk Read Channels, 1997 IEEE International Solid–State Circuits Conference, Feb., 1997.

Vorenkamp, et al., A 10b 50MS/s Pipelined ADC, 1992 IEEE International Solid–State Circuits Conference, Jun., 1992.

Colleran, et al., A 10–b, 75–MHz Two–Stage Pipelined Bipolar A/D Converter, IEEE Journal of Solid–State Circuits, vol. 28, No. 12, Dec. 1993.

Sone, et al., A 10–B 100–Msample/s Pipelined Subranging BiCMOS ADC, IEEE Journal of Solid–State Circuits, vol. 28, No. 12, Dec. 1993.

Venes, et al., An 80–MHz, 80–mW, 8–b CMOS Folding A/D Converter with Distributed Trand–and Hold Preprocessing, IEEE Journal of Solid–State Circuits, vol. 31, No. 12, Dec. 1996.

* cited by examiner

*Primary Examiner*—Peguy JeanPierre
(74) *Attorney, Agent, or Firm*—W. Daniel Swayze, Jr.; Wade James Brady, III; Frederick J. Telecky, Jr.

(57) ABSTRACT

The invention comprises a differential sample-and-hold circuit including a differential gain stage. The differential gain stage comprises a control transistor and an output node. The differential gain stage further comprises a primary load coupled between the control transistor and the output node. A hold control circuit is coupled to the base of the control transistor, the hold control circuit operable to effect a reduction of the base voltage of the control transistor and a corresponding reduction of the voltage at the output node of the differential gain stage.

17 Claims, 1 Drawing Sheet

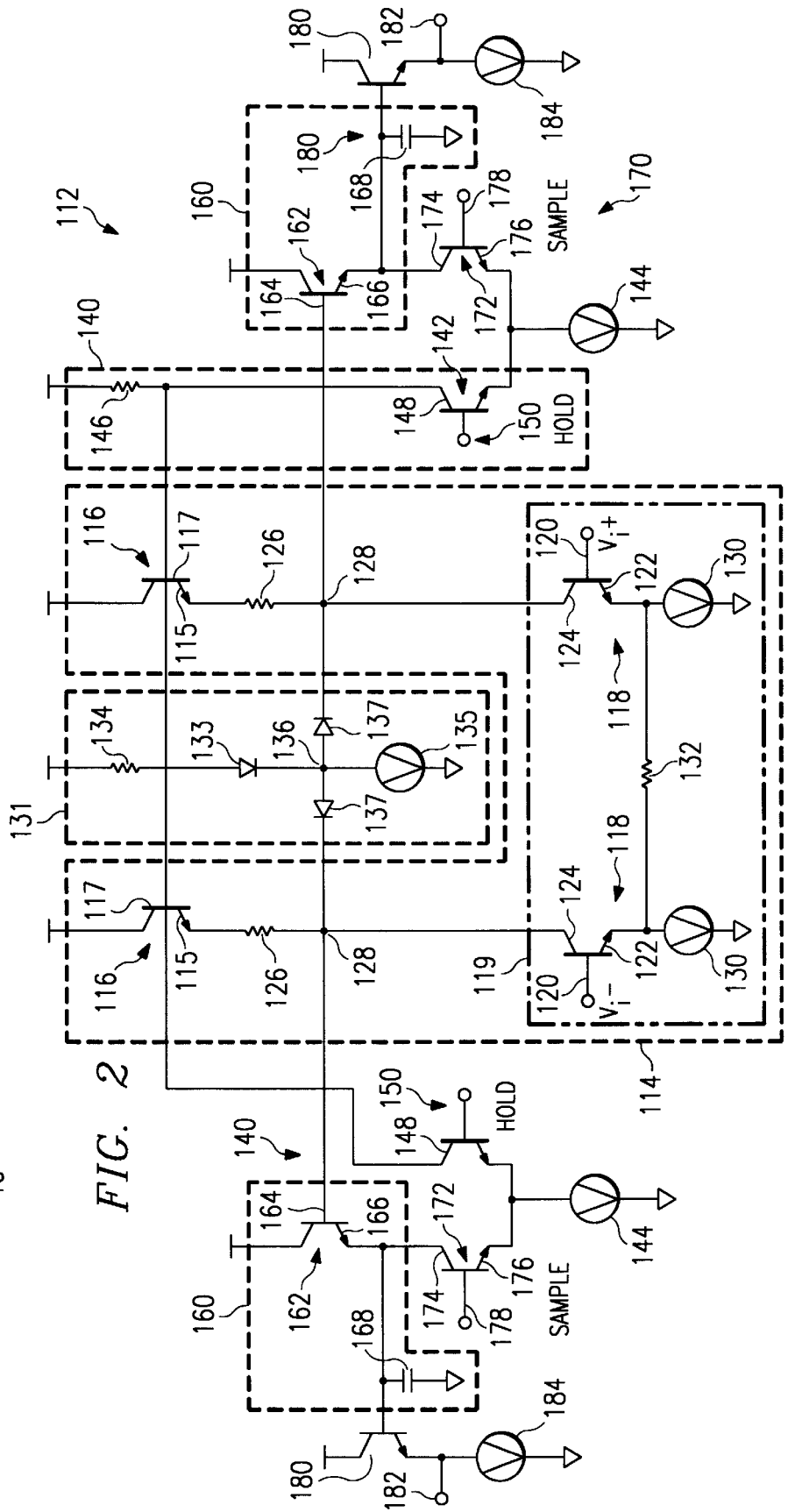

SAMPLE-AND-HOLD CIRCUIT

This application claims priority under 35 USC § 119(e)(1) of provisional application No. 60/063,916 filed Oct. 31, 1997.

TECHNICAL FIELD OF THE INVENTION

This invention relates generally to the field of electronic devices and specifically to a method and apparatus for providing high speed sample-and-hold capabilities.

BACKGROUND OF THE INVENTION

A goal in sample-and-hold circuits is to facilitate high-frequency operation while providing low power consumption. Additionally, it is sometimes desirable to perform one or more mathematical functions on a signal or signals before the resultant signal is sampled and held. The mathematical function may be any combination of multiplication, division, addition or subtraction. Implementing the mathematical function or functions and the sample-and-hold functions separately is typically area and power inefficient. It may be, therefore, desirable to combine the various operations in an efficient way without sacrificing accuracy, speed or power.

One approach to combining these functions is to use a differential gain stage, which performs the mathematical function, to drive a sample-and-hold circuit comprising a CMOS switch and a storage device. A problem with this approach is that the CMOS switch tends to have injection into the storage device, which is level dependant. This level dependency generally degrades the performance of the sample-and-hold circuit. In addition, high speed designs will often preclude the clock from being at levels suitable for proper CMOS operation, because, for example, the voltage level will often be limited to decrease propagation time. In such circumstances, the use of a CMOS switch may be inappropriate because the voltage swing of the signal may not be adequate to turn the switch on and/or off.

Another approach is to use a differential gain stage to drive bipolar junction transistors acting as a switch for the storage device. The bipolar junction transistors often consist of diodes which level shift up and down during sample mode. A problem with this approach is that these switch designs are inefficient and consume power.

Still another approach consists of a differential gain stage having a buffer driver off the load, which directly drives the storage element. In hold mode, the load is directly pulled down while depriving current to the driver. A problem with this approach is that the circuitry required to pull down the load tends to slow the operation of the circuit. Operation at higher speeds typically requires loads with low resistance. Using loads with low resistance generally requires a larger current to pull the voltage of the load down sufficiently to enter hold mode. Thus, this approach requires high current levels for high speed operation. In addition, the voltage on the load may be influenced by variations in the input signal. These variations may propagate to the storage element and corrupt the stored signal.

SUMMARY OF THE INVENTION

In accordance with the teachings of the present invention, a differential sample-and-hold circuit is provided that eliminates or substantially reduces problems associated with prior approaches.

According to one embodiment of the present invention, a differential sample-and-hold circuit comprises a differential gain stage having a control transistor and an output node. The differential gain stage further comprises a primary load coupled between the control transistor and the output node. A hold control circuit is coupled to the base of the control transistor, the hold control circuit operable to effect a reduction of the base voltage of the control transistor and a corresponding reduction of the voltage at the output node of the differential gain stage.

The present invention has several important technical advantages. The invention facilitates combining mathematical and sample-and-hold functions without sacrificing accuracy, speed or power. Controlling the voltage at the output node of the differential gain stage through a voltage drop initiated by the hold control circuit, rather than at the primary load of the differential gain stage, facilitates the use of a low-level current source driving the hold control circuit. The invention, therefore, facilitates lower power consumption due to the low-level current sources used. Scaling the current in an integrated circuit application typically results in smaller device size. Smaller device size provides smaller parasitic capacitances. Lower parasitics, in turn, result in increased device speed. By minimizing the parasitics at the critical nodes, the invention optimizes the speed of the device.

The invention provides a method of switching between sample mode and hold mode by controlling the voltage at the output node of the differential gain stage through choice of the load in the hold control circuit and a current source driving that load. The common-mode sample-and-hold output is determined primarily by the values of the primary load, transconductance element and current source of the differential gain stage. The present invention, therefore, provides a method of setting the common-mode sample-and-hold output voltage which is independent of the method of switching between sample mode and hold mode.

Providing a clamping circuit capable of reducing the gain of the differential gain stage in response to a reduction in voltage at the output node effectively isolates the storage circuit from the rest of the circuit during hold mode. This prevents the input signal from corrupting the stored analog sample. Additionally, the clamping circuit acts to hold the voltage at the output node at or near the voltage on the storage element. Thus, the base voltage of the emitter-follower remains close to its turn-on value, increasing switching speed between sample and hold modes. Furthermore, holding the voltage of the output node at or near the voltage on the storage element ensures that the collector voltage of the gain stage transistor does not fall below that transistor's base voltage. This avoids saturating the gain stage transistor, which would otherwise decrease device speed. Another advantage is that this circuit allows a greater range common mode input voltages because no level shifting of the common mode signal is required.

BRIEF DESCRIPTION OF THE DRAWINGS

A more complete understanding of the teachings of the present invention may be acquired by referring to the accompanying figures in which like reference numbers indicate like features and wherein;

FIG. 1 is a block diagram of an exemplary analog-to-digital conversion system constructed according to the teachings of the present invention; and FIG. 2 is a schematic diagram of an exemplary sample-and-hold circuit constructed according to the teachings of the present invention.

DETAILED DESCRIPTION OF THE INVENTION

FIG. 1 is a block diagram of an exemplary analog-to-digital conversion system constructed according to the teachings of the present invention. An analog-to-digital conversion system 10 may include a sample-and-hold (S/H) circuit 12 operable to receive an analog signal 14, sample portions of analog signal 14 and temporarily store the samples prior to transmission to an analog-to-digital (A/D) converter 18. Details of the construction and function of sample-and-hold circuit 12 will be set forth below.

Analog-to-digital converter 18 receives a sample 16 of analog signal 14 from sample-and-hold circuit 12 and converts analog sample 16 to a digital signal 20. Analog-to-digital converter 18 may comprise any device operable to receive an analog sample and convert the analog sample to a digital signal. For example, analog-to-digital converter 18 may comprise a feedback-type converter, a dual-slope converter, a parallel converter, a charge-redistribution converter, or any other type of analog-to-digital converter.

FIG. 2 is a schematic diagram of an exemplary sample-and-hold circuit 112 constructed according to the teachings of the present invention. Sample-and-hold circuit 112 may function to receive a continuous analog signal and introduce various levels of delay to the signal received. Additionally, sample-and-hold circuit 112 may hold a portion of the continuous signal received to provide a stable portion of the signal to circuitry operable to facilitate further signal processing. Sample-and-hold circuit 112 may be useful in a variety of applications. As described above, sample-and-hold circuit 112 may operate in conjunction with an analog-to-digital converter. In that application, sample-and-hold circuit 112 may reduce dynamic operating requirements of the analog-to-digital converter by providing a stable portion of the continuously varying analog signal. Sample-and-hold circuit 112 may also be applied, for example, in conjunction with an analog state machine (not explicitly shown) to temporarily hold a portion of an analog signal to facilitate various operations by the analog state machine. Sample-and-hold circuit 112 may further be applied in conjunction with a finite impulse response (FIR) filter (not explicitly shown) to provide various levels of delay to an analog input signal, thus facilitating the FIR's operation on various states of the input signal.

Sample-and-hold circuit 112 may comprise a differential gain stage 114. Differential gain stage 114 may include control transistors 116 and output nodes 128. Bases 117 of control transistors 116 may be coupled together. As used in this document, the term "coupled" does not necessarily denote a direct connection between elements. One or more elements may, but need not reside between elements said to be "coupled" to each other. Primary loads 126 may be coupled between emitters 115 of control transistors 116 and output nodes 128.

Differential gain stage 114 may further comprise a transconductor stage 119 coupled to output nodes 128. Transconductor stage 119 may be implemented in a variety of configurations. For example, transconductor stage 119 may be configured to provide circuitry operable to perform various arithmetic functions, such as addition, subtraction, multiplication and/or division.

In one particular embodiment, transconductor stage 119 may include transconductor stage transistors 118 coupled to output node 128. Transconductor stage transistors 118 may receive differential input signals $V_I^-$ and $V_I^+$ at bases 120. Because the operation of this stage is fully differential, the circuit facilitates a wide range of variability in the common mode voltage without affecting the operation of the circuit. First current sources 130 may be coupled to emitters 122 of transconductor stage transistors 118. A transconductance element 132 may further be coupled to emitters 122 of transconductor stage transistors 118. Although first current sources 130 are shown as two separate current sources, a single current source may be coupled to both emitters 122 of transconductor stage transistors 118 (not explicitly shown). In that case, transconductance element 132 may comprise, for example, two separate elements, each element coupled between one side of first current source 130 and an emitter 122 of a transconductor stage transistor 118.

Output nodes 128 may reside between primary loads 126 and collectors 124 of transconductor stage transistors 118. Output nodes 128 provide differential analog output signals to other circuit elements. These output signals may be derived by modifying the differential analog input signals $V_I^-$ and $V_I^+$ by a gain factor, N. In this embodiment, the gain factor N may be proportional, at least in part, to the ratio of primary load 126 to transconductance element 132. Primary loads 126 and transconductance elements 132 may comprise, for example, resistors chosen to provide a particular gain factor, N. The values of primary load 126 and transconductance element 132 may be selected to amplify the input signal, depress the input signal or to provide unity gain, depending upon the particular application.

A hold control circuit 140 may be coupled to bases 117 of control transistors 116. Hold control circuit 140 may include one or more hold stage transistors 142 coupled between bases 117 of control transistors 116 and second current sources 144. Hold control circuit 140 may further include a hold stage load 146 coupled to bases 117 of control transistors 116 and to collector 148 of hold stage transistors 142. Hold stage load 146 may be, for example, a resistor selected to provide a particular voltage drop to bases 117 of control transistors 116 upon activation of hold control circuit 140. Hold control circuit 140 may be activated upon receiving a hold mode signal at bases 150 of hold stage transistors 142.

Sample-and-hold circuit 112 may further include at least one storage circuit 160 coupled to output node 128 of differential gain stage 114. Each storage circuit 160 may comprise a storage stage transistor 162 having a base 164 coupled to output node 128. A storage element 168 may be coupled to emitter 166 of storage stage transistor 162. Storage element 168 may comprise, for example, a storage capacitor operable to receive an analog signal from output node 128 and to temporarily store the analog signal prior to transmission to an analog-to-digital converter.

A sample control circuit 170 may be coupled to each storage circuit 160. Each sample control circuit 170 may comprise a sample stage transistor 172 having a collector 174 coupled to emitter 166 of a storage stage transistor 162. Emitter 176 of sample stage transistor 172 may be coupled to one of the second current sources 144. Sample control circuit 170 may be activated by applying a sample mode signal to base 178 of sample stage transistor 172. Although hold control circuit 140 and sample control circuit 170 are shown as sharing a common current source 144, separate current sources could be implemented without departing from the scope of the invention.

Sample-and-hold circuit 112 may further include a clamping circuit 131 coupled between output nodes 128 of differential gain stage 114. Clamping circuit 131 may comprise a clamping load 134 coupled to a third current source 135 at a clamping node 136. Clamping load 134 may be a resistor selected to ensure that clamping circuit 131 remains inactive while hold control circuit 140 is inactive, and becomes active upon activation of hold control circuit 140. Clamping circuit 131 may further comprise clamping diodes 137 coupled between clamping node 136 and output nodes 128. Although FIG. 2 shows the use of two clamping diodes 137, any number of clamping diodes 137 may be used without departing from the scope of the invention. In addition, diode 133 may be coupled between clamping load 134 and clamping node 136. Diode 133 may comprise a diode, or a transistor having its base connected to its collector. Diode 133 may be included so that its voltage offsets the base-emitter voltage of control transistors 116.

An output stage transistor 180 may be coupled to storage element 168. A fourth current source 184 may be coupled to output stage transistor 180. Fourth current source 184 may operate to allow the voltage at output node 182 to follow the voltage on storage element 168 during hold mode. The analog sample may be passed from output node 182 to a variety of circuitry for further signal processing. For example, the output signal from sample-and-hold circuit 112 may be passed to an analog-to-digital converter, a finite impulse response filter or an analog state machine.

In operation, sample-and-hold circuit 112 may receive differential analog input signals $V_I^-$ and $V_I^+$ at bases 120 of differential transconductor stage transistors 118. Transconductor stage 119 may optionally perform selected mathematical functions on input signals $V_I^-$ and $V_I^+$, prior to passing the signals to output nodes 128. Sample-and-hold circuit 112 may operate in a sample mode, for example, by activating sample control circuit 170 with a sample mode signal to base 178 of sample stage transistor 172. Hold control circuit 140 may remain inactive while sample control circuit 170 is active. The values of first current source 130, third current source 135, primary load 126 and clamping load 134 may be selected so that when hold control circuit 140 is inactive, the voltage at output nodes 128 exceeds the voltage at clamping node 136. Clamping diodes 137, thus remain reverse biased and nonconductive during sample mode.

During sample mode, where clamping diodes are reversed biased, the gain value N of differential gain stage 114 is proportional to the ratio of primary load 126 to transconductance element 132. If, for example, primary load 126 and transconductance element 132 are selected to provide a unity gain, the voltage at output nodes 128 approximately tracks the differential input signal. As described above, sample-and-hold circuit 112 may be designed so that when sample control circuit 170 is active, hold control circuit 140 remains inactive. When-sample stage transistor 172 is activated, storage stage transistor 162 acts as an emitter-follower so that the voltage at node 180 approximately follows the voltage at output nodes 128.

When the time comes to enter hold mode, sample control circuit 170 may be deactivated and hold control circuit 140 may be activated. Applying a hold mode signal to base 150 of hold stage transistor 142 activates hold stage transistor 142 allowing second current source 144 to create a voltage drop across hold stage load 146. The voltage drop across hold stage load 146 creates a corresponding voltage drop at base 117 of control transistor 116, and likewise a corresponding voltage drop at output nodes 128. The values of second current source 144 and hold stage load 146 may be selected so that the voltage drop obtained upon activation of hold control circuit 140, and the corresponding voltage drop at output nodes 128, is sufficient to forward bias clamping diodes 137 of clamping circuit 131. The present invention provides an advantage of allowing selection of a high resistance at hold stage load 146 to achieve a desired voltage drop, while utilizing a low-level current source 144. Facilitating the use of a low-level current source provides advantages of increased device efficiency and speed as well as accommodating reduced device size.

Forward biasing clamping diodes 137 creates a relatively low impedance path. This low impedance path acts to clamp the voltage at output nodes 128 at or near the voltage on storage elements 168, which correspond to the emitter voltages of storage stage transistor 162. Clamping the base voltages of storage transistors 162 at or near the turn-on voltage of storage transistors 162 increases switching speeds between sample mode and hold mode.

Forward biasing clamping diodes 137 effectively couples these elements in parallel with primary load 126 of differential gain circuit 114. Connecting the relatively small impedance of clamping diodes 137 in parallel with the relatively larger impedance of primary loads 126 substantially reduces the effective impedance of the combination. Because gain factor N depends on the ratio of the impedance of primary load 126 to that of transconductance element 132, a reduction in the impedance of primary load 126 causes a corresponding reduction in gain factor N. By reducing gain factor N, the present invention ensures that the voltage at output nodes 128 remains relatively constant, despite fluctuations in input signals $V_I^-$ and $V_I^+$. Thus, the present invention avoids saturation of transconductor stage transistor 120 by ensuring that the collector voltage remains above or near the base voltage of the transistor. By clamping the output node voltage and decreasing the gain factor N, the present invention eliminates radical fluctuations in the output node voltage which could activate storage stage transistor 172 and corrupt the stored analog sample.

Although the present invention has been described in detail it should be understood that various changes and substitutions may be made hereto without departing from the scope of the present invention as defined by the appended claims.

What is claimed is:

1. A differential sample-and-hold circuit, comprising:
   a differential gain stage having a control transistor and an output node, the differential gain stage further having a primary load coupled between the control transistor and the output node; and
   a hold control circuit coupled to the base of the control transistor, the hold control circuit operable to effect a reduction of the base voltage of the control transistor and a corresponding reduction of the voltage at the output node of the differential gain stage;
   wherein the hold circuit comprises:
      a hold stage transistor coupled between a current source and the base of the control transistor, the hold stage transistor operable to receive at its base a hold mode signal and to become conductive in response to the hold mode signal; and
      a hold stage load coupled to the base of the control transistor and to the collector of the hold stage transistor.

2. The differential sample-and-hold circuit of claim 1, wherein the differential gain stage comprises a transconductor stage coupled to the output node of the differential gain stage.

3. The differential sample-and-hold circuit of claim 1, further comprising:
   a storage circuit operable to receive and store an analog sample from the output node of the differential gain stage; and
   a sample control circuit coupled between the second current source and the storage circuit.

4. The differential sample-and-hold circuit of claim 3, wherein the storage circuit comprises:
- a storage stage transistor having its base coupled to the output node of the differential gain stage; and
- a storage element coupled to the emitter of the storage stage transistor.

5. The differential sample-and-hold circuit of claim 3, wherein the sample control circuit comprises a sample stage transistor coupled between the second current source and the storage circuit, the sample stage transistor operable to receive at its base a sample mode signal and to become conductive in response to the sample mode signal.

6. The differential sample-and-hold circuit of claim 1, further comprising a clamping circuit coupled to the output node of the differential gain stage, the clamping circuit operable to reduce the impedance of the primary load in response to a decrease in the voltage at the output node, causing a reduction in the gain of the differential gain stage.

7. The differential sample-and-hold circuit of claim 6, wherein the clamping circuit comprises:
- a clamping load coupled to an additional current source at a clamping node; and
- a clamping diode coupled between the clamping node and the output node of the differential gain stage.

8. An analog-to-digital convertor, comprising:
- a differential sample-and-hold circuit operable to receive a differential analog input, to sample the analog input and to store a sample of the analog input, the sample-and-hold circuit comprising:
  - a differential gain stage having a control transistor and an output node, the differential gain stage further having a primary load coupled between the control transistor and the output node;
  - a storage circuit operable to receive and store an analog sample from the output node of the differential gain stage; and
  - a hold control circuit coupled to the base of the control transistor, the hold control circuit operable to effect a reduction of the base voltage of the control transistor and a corresponding reduction of the voltage at the output node of the differential gain stage; and
- a conversion circuit operable to receive the analog sample from the storage circuit and to convert the analog sample to a digital signal;
- wherein the hold control circuit comprises:
  - a hold stage transistor coupled between a second current source and the base of the control transistor, the hold stage transistor operable to receive at its base a hold mode signal and to become conductive in response to the hold mode signal; and
  - a hold stage load coupled to the base of the control transistor and to the collector of the hold stage transistor.

9. The analog-to-digital convertor of claim 8, wherein the differential gain stage comprises a transconductor stage coupled to the output node of the differential gain stage.

10. The analog-to-digital convertor of claim 8, further comprising a sample control circuit coupled between the second current source and the storage circuit.

11. The analog-to-digital convertor of claim 10, wherein the sample control circuit comprises a sample stage transistor coupled between the second current source and the storage circuit, the sample stage transistor operable to receive at its base a sample mode signal and to become conductive in response to the sample mode signal.

12. The analog-to-digital convertor of claim 8, further comprising a clamping circuit coupled to the output node of the differential gain stage, the clamping circuit operable to reduce the impedance of the primary load in response to a decrease in the voltage at the output node, and causing a reduction in the gain of the differential gain stage.

13. The analog-to-digital convertor of claim 12, wherein the clamping circuit comprises:
- a clamping load coupled to a current source at a clamping node; and
- a clamping diode coupled between the clamping node and the output node of the differential gain stage.

14. A method of isolating the storage stage of a sample-and-hold circuit, comprising:
- receiving at a differential gain stage a differential analog input signal, the differential gain stage having a control transistor and an output node, the differential gain stage further having a primary load coupled between the control transistor and the output node;
- activating a sample control circuit to pass the amplified signal from an output node of the differential gain stage to the input of a storage circuit; and
- storing a sample of the amplified signal in the storage circuit by deactivating the sample control circuit and activating a hold control circuit to cause a reduction of the voltage at the base of the control transistor the differential gain stage, and a corresponding reduction of the common mode voltage at the output node of the differential gain stage;
- further comprising activating a clamp circuit in response to the reduction in voltage at the output node, the clamping circuit coupled to the output node of the differential gain stage, the activation of the clamping circuit also reducing the impedance of the primary load of the differential gain stage, and causing a reduction in the gain of the differential gain stage.

15. The method of claim 14, wherein activating a clamping circuit comprises reducing the voltage at the output node of the differential gain stage sufficiently to forward bias a control diode connected in parallel with the primary load.

16. An analog-to-digital convertor, comprising:
- a differential sample-and-hold circuit operable to receive a differential analog input, to sample the analog input and to store a sample of the analog input, the sample-and-hold circuit comprising:
  - a differential gain stage having a control transistor and an output node, the differential gain stage further having a primary load coupled between the control transistor and the output node;
  - a storage circuit operable to receive and store an analog sample from the output node of the differential gain stage; and
  - a hold control circuit coupled to the base of the control transistor, the hold control circuit operable to effect a reduction of the base voltage of the control transistor and a corresponding reduction of the voltage at the output node of the differential gain stage; and
- a conversion circuit operable to receive the analog sample from the storage circuit and to convert the analog sample to a digital signal;
- wherein the storage circuit comprises:
  - a storage stage transistor having its base coupled to the output node of the differential gain stage; and
  - a storage element coupled to the emitter of the storage stage transistor.

17. A method of isolating the storage stage of a sample-and-hold circuit, comprising:

receiving at a differential gain stage a differential analog input signal, the differential gain stage having a control transistor and an output node, the differential gain stage further having a primary load coupled between the control transistor and the output node;

activating a sample control circuit to pass the amplified signal from an output node of the differential gain stage to the input of a storage circuit; and storing a sample of the amplified signal in the storage circuit by deactivating the sample control circuit and activating a hold control circuit to cause a reduction of the voltage at the base of the control transistor of the differential gain stage, and a corresponding reduction of the common mode voltage at the output node of the differential gain stage;

wherein activating the hold control circuit to effect a reduction of the voltage at the output node of the differential gain stage comprises:

applying a hold mode signal to the hold control circuit, the hold control circuit comprising a hold stage transistor coupled between a second current source and the base of the control transistor, the hold control circuit further comprising a hold stage load coupled to the base of the control transistor and to the collector of the hold stage transistor; and drawing current from the second current source through the hold stage load to create a voltage drop across the hold stage load and a corresponding voltage drop across the base of the control transistor.

* * * * *